(12) United States Patent
Kawakami et al.

(10) Patent No.: US 12,148,899 B2
(45) Date of Patent: *Nov. 19, 2024

(54) BATTERY SYSTEM

(71) Applicant: TOYOTA JIDOSHA KABUSHIKI KAISHA, Toyota (JP)

(72) Inventors: Masatsugu Kawakami, Shizuoka-ken (JP); Yasumasa Oguma, Shizuoka-ken (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/539,633

(22) Filed: Dec. 14, 2023

(65) Prior Publication Data

US 2024/0113347 A1    Apr. 4, 2024

Related U.S. Application Data

(63) Continuation of application No. 17/329,444, filed on May 25, 2021, now Pat. No. 11,881,567.

(30) Foreign Application Priority Data

Jun. 12, 2020    (JP) .................................. 2020-102286

(51) Int. Cl.
    *H01M 10/48*    (2006.01)
    *G01R 31/3835*    (2019.01)
    (Continued)

(52) U.S. Cl.
    CPC ...... *H01M 10/482* (2013.01); *G01R 31/3835* (2019.01); *G01R 31/3842* (2019.01);
    (Continued)

(58) Field of Classification Search
    CPC ............. H01M 10/482; H01M 10/486; H01M 2220/20; H01M 10/443; H01M 10/48;
    (Continued)

(56) References Cited

U.S. PATENT DOCUMENTS 7,791,317 B2 *  9/2010  Suzuki .................. H01M 10/48
                                                            320/139
8,264,201 B2 *  9/2012  Tae ..................... H02J 7/00304
                                                            324/426
(Continued)

FOREIGN PATENT DOCUMENTS

DE    102019115705 A1 *  6/2020  ................ B60L 3/12
EP       2600487 A1 *  6/2013  .......... H01M 10/425
(Continued)

OTHER PUBLICATIONS

A. Caliwag, K. L. Muh, S. H. Kang, J. Park and W. Lim, "Design of Modular Battery Management System with Point-to-point Soc Estimation Algorithm," 2020 International Conference on Artificial Intelligence in Information and Communication (ICAIIC), Fukuoka, Japan, 2020, pp. 701-704 (Year: 2020).

(Continued)

*Primary Examiner* — M Baye Diao
(74) *Attorney, Agent, or Firm* — Dickinson Wright, PLLC

(57) ABSTRACT

A battery system that avoids an over discharge with a simple sensor element is provided. The battery system comprises: a battery pack including a plurality of battery cells connected in series, a monitoring unit that monitors a condition of the battery pack, and a control unit that controls a discharge of the battery pack. The control unit calculates capacity condition A of the battery pack at a first discharge cutoff voltage based on the total voltage and the total current, estimates capacity condition B of the battery pack at the first discharge cutoff voltage based on the total current and the temperature, determines an occurrence of an over discharge based on the (Continued)

capacity condition A and the capacity condition B, changes the first discharge cutoff voltage to a second discharge cutoff voltage that is higher than the first discharge cutoff voltage, when the occurrence of the over discharge is determined.

4 Claims, 5 Drawing Sheets

(51) Int. Cl.
  *G01R 31/3842* (2019.01)
  *H02J 7/00* (2006.01)
(52) U.S. Cl.
  CPC ......... *H01M 10/486* (2013.01); *H02J 7/0025* (2020.01); *H01M 2220/20* (2013.01)
(58) Field of Classification Search
  CPC ....... H01M 10/425; H01M 2010/4271; H01M 10/4285; H01M 10/441; G01R 31/3835; G01R 31/3842; G01R 31/392; G01R 31/396; H02J 7/0025; H02J 7/00306; H02J 7/0048; Y02E 60/10
  USPC ......................................................... 320/134
  See application file for complete search history.

(56) References Cited

U.S. PATENT DOCUMENTS

| | | | |
|---|---|---|---|
| 8,519,716 B2 * | 8/2013 | Kurata | G01R 31/3842 320/152 |
| 8,994,333 B2 * | 3/2015 | Kim | H02J 7/0031 320/135 |
| 9,537,326 B2 * | 1/2017 | Troxel | H01M 10/488 |
| 9,548,615 B2 * | 1/2017 | Takeo | E02F 9/2091 |
| 10,044,200 B2 * | 8/2018 | Tsurumaru | H02J 3/32 |
| 10,181,622 B2 * | 1/2019 | Arai | H01M 10/4257 |
| 10,218,036 B2 * | 2/2019 | Yoshida | H01M 10/482 |
| 10,347,952 B2 * | 7/2019 | Choi | G01R 31/3648 |
| 11,262,408 B2 * | 3/2022 | Zhu | B60L 58/14 |
| 11,460,511 B2 * | 10/2022 | Kim | G01R 31/392 |
| 2014/0152261 A1 | 6/2014 | Yamauchi et al. | |
| 2016/0226263 A1 * | 8/2016 | Seo | H02J 7/005 |
| 2019/0361076 A1 | 11/2019 | Koyamada et al. | |
| 2021/0257680 A1 * | 8/2021 | Komiyama | H02J 7/0047 |

FOREIGN PATENT DOCUMENTS

| | | | | |
|---|---|---|---|---|
| EP | 3076478 B1 * | 6/2019 | | B60L 50/51 |
| EP | 3411261 B1 * | 8/2021 | | B60L 58/12 |
| JP | 3930041 B1 * | 6/2007 | | Y02E 60/10 |
| JP | 4762241 B2 | 8/2011 | | |
| JP | 2019024307 A | 2/2019 | | |
| JP | 2019203777 A | 11/2019 | | |
| WO | WO-2011132434 A1 * | 10/2011 | | B60L 11/1851 |

OTHER PUBLICATIONS

Masatsugu Kawakami et al., U.S. Appl. No. 17/329,444, Ex Parte Quayle Action dated Aug. 16, 2023.
Masatsugu Kawakami et al., U.S. Appl. No. 17/329,444, Notice of Allowance dated Sep. 20, 2023.

* cited by examiner

BATTERY SYSTEM

TECHNICAL FIELD

The present disclosure relates to a battery system.

BACKGROUND ART

A technology for preventing an over discharge of a battery has been known. For example, Patent Literature 1 discloses a battery system comprising a cell group including a plurality of single battery cells electrically connected in series, wherein the battery system includes a plurality of voltage detecting lines provided to input the voltage between respective terminals of the plurality of single battery cells to a first control device.

Also, Patent Literature 2 discloses a method for estimating a deterioration condition of each single battery in an all solid state lithium secondary battery including a plurality of single batteries connected in series, wherein the deterioration condition of each single battery is estimated based on an actual SOC-OCV curve and a SOC-OCV curve with large coincidence degree to the actual SOC-OCV curve. Further, Patent Literature 2 discloses to determine the lowest discharge voltage of the all solid state lithium secondary battery according to the deterioration condition of the most deteriorated single battery.

CITATION LIST

Patent Literatures

Patent Literature 1: Japanese Patent Application Laid-Open (JP-A) No. 2019-024307
Patent Literature 2: JP-A 2019-203777

SUMMARY OF DISCLOSURE

Technical Problem

In Patent Literature 1, the voltage between respective terminals of the plurality of battery cells is measured. In this case, a voltage detecting line is necessary per battery cell so that the sensor element is likely to be complicated.

The present disclosure has been made in view of the above circumstances, and a main object thereof is to provide a battery system capable of avoiding an over discharge with a simple sensor element.

Solution to Problem

In order to achieve the object, the present disclosure provides a battery system comprising: a battery pack including a plurality of battery cells connected in series, a monitoring unit configured to monitor a condition of the battery pack, and a control unit configured to control at least a discharge of the battery pack, and the monitoring unit includes: a voltage sensor configured to measure a total voltage of the battery pack, a current sensor configured to measure a total current of the battery pack, and a temperature sensor configured to measure a temperature of the battery pack, the control unit includes: a calculating section configured to calculate capacity condition A of the battery pack at a first discharge cutoff voltage based on the total voltage and the total current, an estimating section configured to estimate capacity condition B of the battery pack at the first discharge cutoff voltage based on the total current and the temperature, a determining section configured to determine an occurrence of an over discharge based on the capacity condition A and the capacity condition B, and a voltage changing section configured to change the first discharge cutoff voltage to a second discharge cutoff voltage that is higher than the first discharge cutoff voltage, when the occurrence of the over discharge is determined.

According to the present disclosure, a battery system capable of avoiding an over discharge with a simple sensor element may be obtained by determining the occurrence of an over discharge based on the total voltage, the total current, and the temperature, and changing the first discharge cutoff voltage to the second discharge cutoff voltage.

In the disclosure, the voltage changing section may specify capacity condition C corresponding to voltage $\alpha$ in an estimated discharge curve of an over discharged cell, may specify voltage $\beta$ corresponding to the capacity condition C in an actually measured discharge curve of the battery pack, and may set the second discharge cutoff voltage based on the voltage $\beta$.

In the disclosure, the voltage $\alpha$ may be a voltage of 0 V or more.

In the disclosure, the monitoring unit may include no voltage sensor configured to measure a voltage of the battery cell individually.

Advantageous Effects of Disclosure

The battery system in the present disclosure exhibits an effect that an over discharge may be avoided with a simple sensor element.

DESCRIPTION OF EMBODIMENTS

A battery system in the present disclosure will be hereinafter described in detail.

Figure 1:
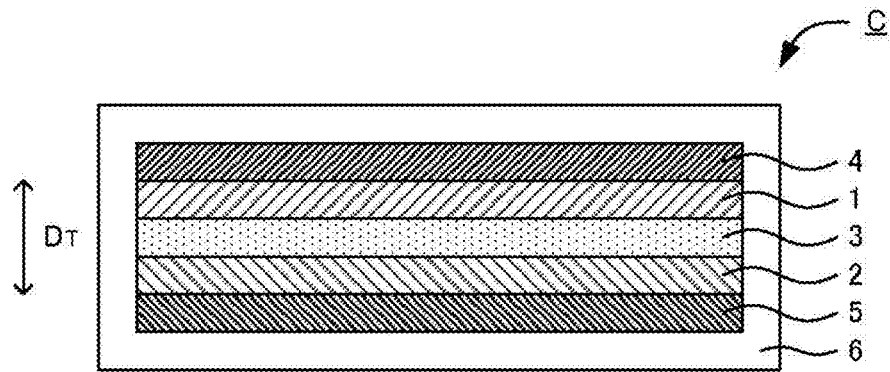
FIG. 1 is a schematic cross-sectional view illustrating an example of a battery cell in the present disclosure.

FIG. 1 is a schematic cross-sectional view illustrating an example of the battery cell in the present disclosure. Battery cell C shown in FIG. 1 includes cathode layer 1, anode layer 2, electrolyte layer 3 formed between cathode layer 1 and anode layer 2, cathode current collector 4 configured to collect currents of cathode layer 1, anode current collector 5 configured to collect currents of anode layer 2, and exterior body 6 configured to store them. Also, in the battery pack in the present disclosure, a plurality of battery cells are connected in series. The plurality of battery cells are preferably placed along the thickness direction (direction $D_T$ in FIG. 1).

Figure 2:
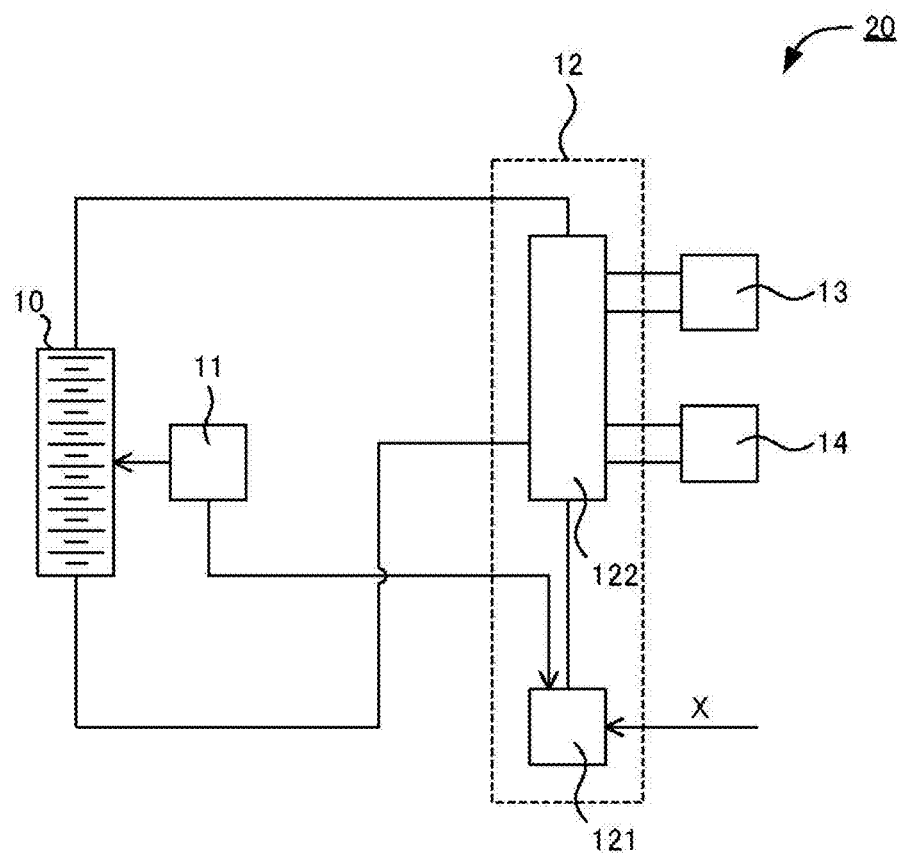
FIG. 2 is a schematic view illustrating a battery system in the present disclosure.

FIG. 2 is a schematic view illustrating a battery system in the present disclosure. Battery system 20 shown in FIG. 2 includes battery pack 10 including a plurality of battery cells connected in series. Further, battery system 20 includes monitoring unit 11 configured to monitor the condition of battery pack 10. Monitoring unit 11 includes a voltage sensor configured to measure the total voltage of battery pack 10, a current sensor configured to measure the total current of battery pack 10, and a temperature sensor configured to measure the temperature of battery pack 10.

Also, battery system 20 shown in FIG. 2 includes control unit 12 configured to control the charge and the discharge of battery pack 10. Control unit 12 includes, for example, ECU (Electronic Control Unit) 121 and PCU (Power Control Unit) 122. ECU 121 instructs (such as start instruction and stop instruction) PCU 122 to charge/discharge based on demand X (such as charge demand and discharge demand) from the outside, and a battery condition (battery pack 10 condition) obtained from monitoring unit 11. PCU 122 receives electric power from power source 13 during charge, and supplies electric power to load 14 during discharge. Control unit 12 determines the occurrence of an over discharge based on the total voltage, the total current, and the temperature, and changes the first discharge cutoff voltage to a second discharge cutoff voltage that is higher than the first discharge cutoff voltage.

Figure 3A:
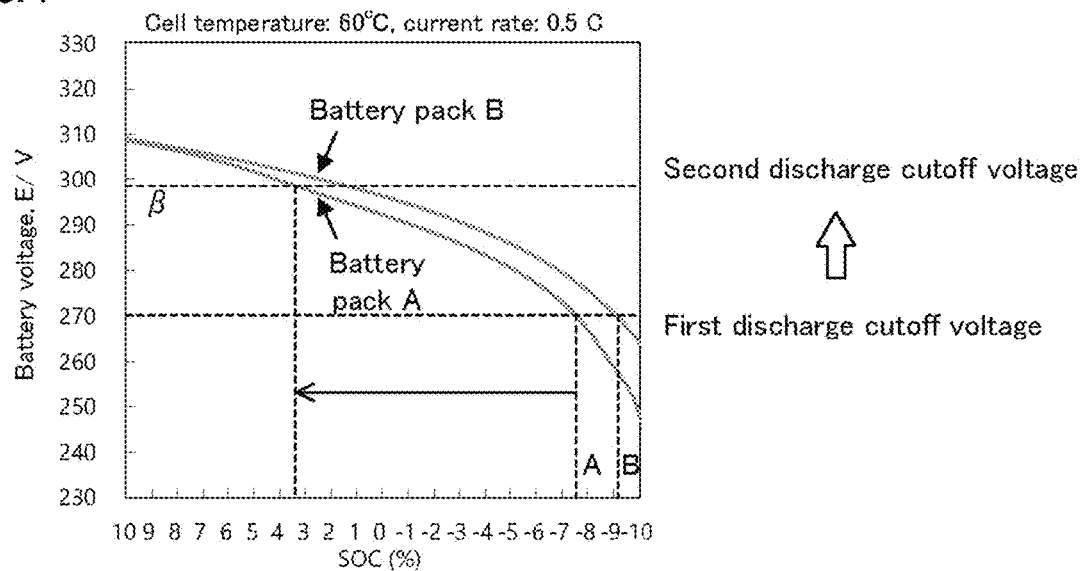
FIGS. 3A and 3B are graphs explaining a battery system in the present disclosure.
Figure 3B:
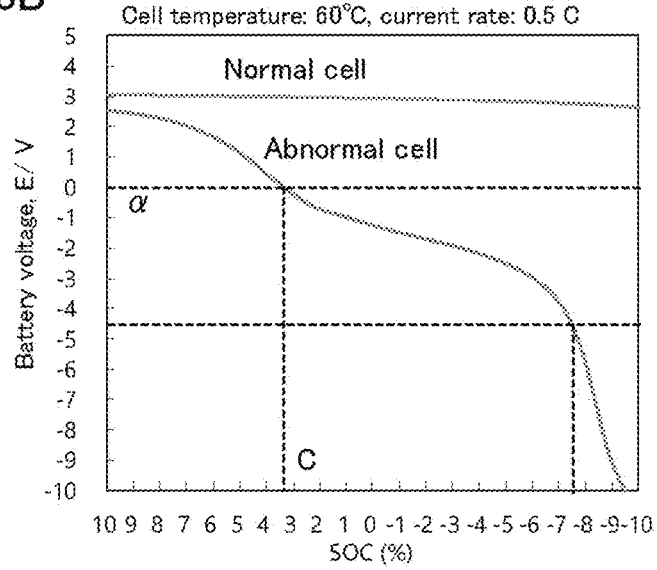

FIG. 3A is a graph explaining a battery system in the present disclosure, and specifically shows a discharge curve of the battery pack including 100 battery cells connected in series. Battery pack A is a battery pack including 99 normal cells and 1 abnormal cell, and battery pack B is a battery pack including 100 normal cells. Here, as shown in FIG. 3B, the capacity decrease of the abnormal cell is larger compared to normal cell, and typically, corresponds to a battery cell deteriorated over time due to charge/discharge faster. Incidentally, in FIG. 3B, the closed circuit voltage of 3 V in a normal cell is set to SOC (State of Charge) 0%, and in FIG. 3A, the voltage is shown lower for the over voltage (current value×cell resistance).

In FIG. 3A, the first discharge cutoff voltage is set to 270 V, and at the first discharge cutoff voltage, the SOC of battery pack A is −7.5% and the SOC of battery pack B is −9%. Here, as shown in FIG. 3B, when the SOC of an abnormal cell is −7.5%, the voltage of the abnormal cell is −4.5 V, and the performance is deteriorated due to the over discharge. Meanwhile, as shown in FIG. 3B, when the SOC of the abnormal cell is 3.5%, the voltage of the abnormal cell is 0 V, and the performance is not deteriorated due to the over discharge. In FIG. 3A, since the voltage of battery pack A corresponding to SOC 3.5% is 298 V, the occurrence of the over discharge during charge/discharge after that may be suppressed by raising the discharge cutoff voltage from 270 V (first discharge cutoff voltage) to 298 V (second discharge cutoff voltage).

Figure 4A:
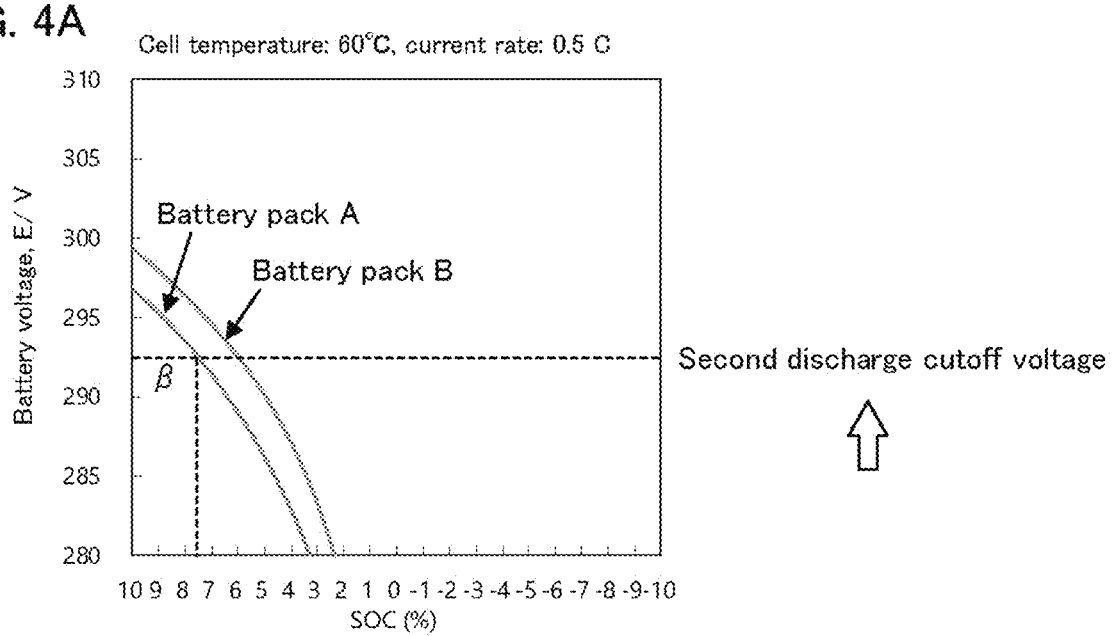
FIGS. 4A and 4B are graphs explaining a battery system in the present disclosure.
Figure 4B:
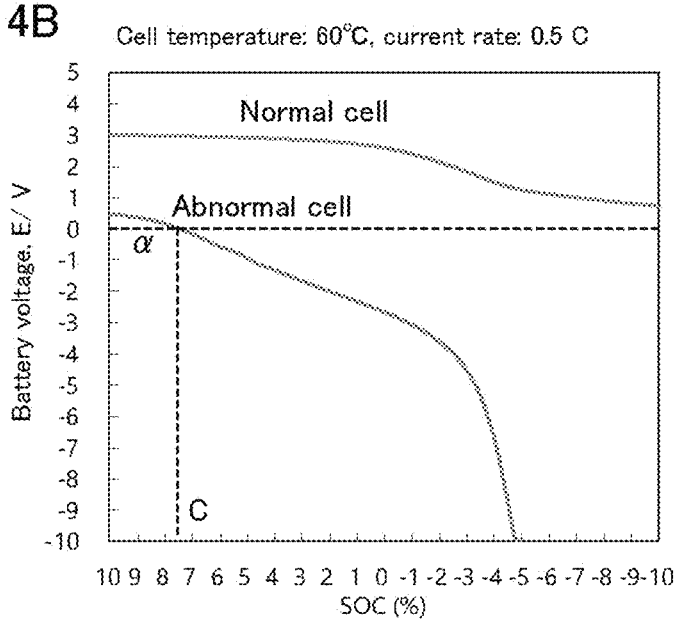

Also, FIGS. 4A and 4B are graphs when the current rate (0.5 C) in FIGS. 3A and 3B is changed to 5 C. As shown in FIG. 4B, when the SOC of the abnormal cell is 7.5%, the voltage of the abnormal cell is 0 V, and the performance is not deteriorated due to the over discharge. In FIG. 4A, since the voltage of battery pack A corresponding to SOC 7.5% is 293 V, the occurrence of the over discharge during charge/discharge after that may be suppressed by raising the discharge cutoff voltage from 270 V (first discharge cutoff voltage) to 293 V (second discharge cutoff voltage).

According to the present disclosure, a battery system capable of avoiding an over discharge with a simple sensor element may be obtained by determining the occurrence of an over discharge based on the total voltage, the total current, and the temperature, and changing the first discharge cutoff voltage to the second discharge cutoff voltage.

As described above, in Patent Literature 1, the voltage between respective terminals of the plurality of battery cells is measured. In this case, a voltage detecting line is necessary per single battery cell so that the sensor element is likely to be complicated. In contrast to this, since there is no need to provide the voltage detecting line per battery cell in the present disclosure, the sensor element may be simplified.

Figure 5:
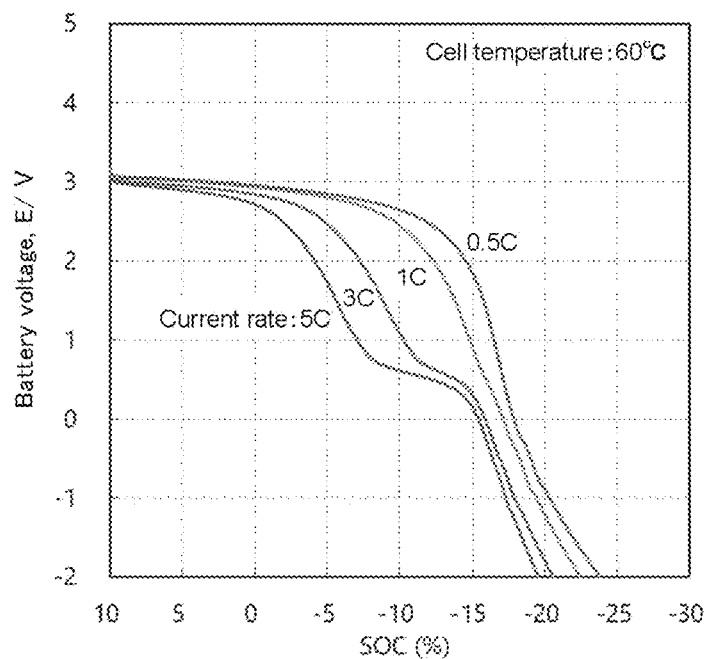
FIG. 5 is a graph showing a current rate dependency of a battery cell.
Figure 6:
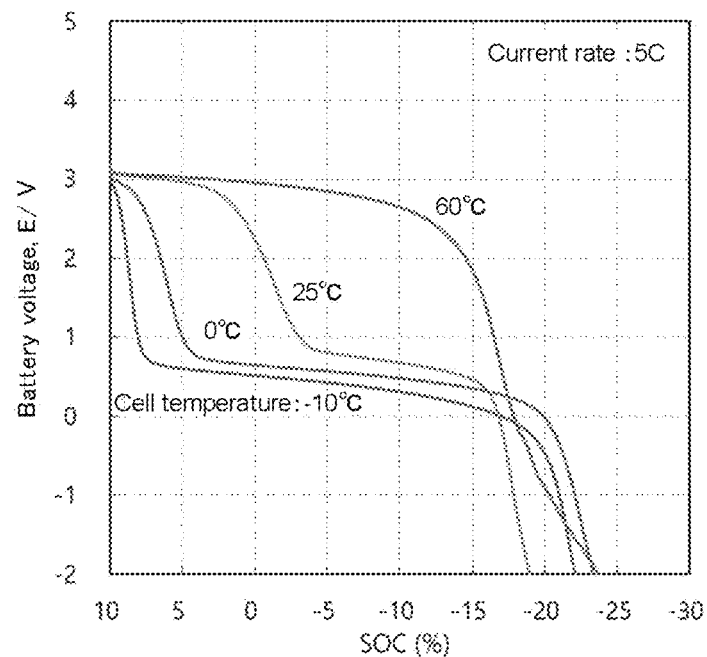
FIG. 6 is a graph showing a temperature dependency of a battery cell.

The drastic change, due to current value and temperature, of the voltage behavior during discharge in low capacity region was focused in the present disclosure. Specifically, FIG. 5 shows the voltage behavior during discharge when the cell temperature was fixed at 60° C., and the current rate (current value) was changed. As shown in FIG. 5, even when the current rate was changed, the voltage behavior during discharge was the same until 3 V. In contrast to this, in the region less than 3 V, as the current rate was higher, the timing of the drastic voltage decrease was earlier. Also, FIG. 6 shows the voltage behavior during discharge when the current rate was fixed at 5 C, and the cell temperature was changed. As shown in FIG. 6, even when the current value (current rate) was changed, the voltage behavior during discharge was the same until 3 V. In contrast to this, in the region less than 3 V, as the cell temperature was lower, the timing of the drastic voltage decrease was earlier.

As described above, the voltage behavior during discharge drastically changes due to current value and temperature in low capacity region. However, a battery system capable of avoiding an over discharge with a simple sensor element may be obtained by determining the occurrence taking these into consideration, and changing the first discharge cutoff voltage to the second discharge cutoff voltage.

1. Control Unit

The control unit in the present disclosure controls at least a discharge of the battery pack. Among the above, the control unit preferably controls discharge and charge of the battery pack.

The control unit preferably includes ECU configured to determine start, continue and stop of the discharge (preferably discharge and charge) based on the battery information obtained from the monitoring unit; and PCU configured to carry out the start, continue and stop of the discharge (preferably discharge and charge) of the battery pack based on the determination of the ECU.

The ECU is configured to determine the start, continue and stop of the discharge (preferably discharge and charge) based on the battery information obtained from the monitoring unit. The ECU usually includes a CPU (Central Processing Unit), a memory, an input/output port configured to input and output various signals. The memory includes, for example, a ROM (Read Only Memory), a RAM (Random Access Memory), and a non-volatile memory that is rewritable. Various processing are carried out by a program stored in the memory being carried out by CPU.

The ECU includes at least a calculating section, an estimating section, a determining section, and a voltage changing section as a processing block configured to realize the function.

The calculating section is set to calculate capacity condition A of the battery pack at the first discharge cutoff voltage, based on the total voltage and the total current. The "capacity condition" is referred to a condition relating the capacity of the battery pack; examples thereof may include SOC (State of Charge), and discharge capacity. Also, capacity condition A is an actually measured capacity condition, and condition A in FIG. 3A, for example, corresponds thereto. Also, the calculating section preferably obtains the total voltage (voltage value) over time from the voltage sensor, and preferably obtains the total current (current value) over time from the current sensor. For example, SOC which corresponds to capacity condition A may be calculated from the integrated value of the total current until the total voltage reaches the first discharge cutoff voltage, and the nominal capacity (rated capacity).

The value of the first discharge cutoff voltage is not particularly limited, and is, for example, 2.3 N (N is the number of the battery cells in the battery pack) or more, may be 2.5 N or more, and may be 2.7 N or more. Meanwhile, the value of the first discharge cutoff voltage is not particularly limited, and is for example, 3.3 N or less, and may be 3.1 N or less.

The estimating section is set to estimate capacity condition B of the battery pack at the first discharge cutoff voltage based on the total current (current value) and the temperature. Capacity condition B is a capacity condition of the battery pack wherein the over discharge has not occurred, condition B in FIG. 3A, for example, corresponds thereto. Also, the estimating section preferably obtains the total current (current value) over time from the current sensor, and preferably obtains the temperature over time from the temperature sensor. Further, the estimating section may be set to estimate capacity condition B based on the number of discharge. Since the capacity decrease is likely to occur as the number of discharge increases, capacity condition B may be estimated more accurately by considering the number of discharge.

Based on the total current (current value) and the temperature, the estimating section preferably select the data with the highest coincidence degree as capacity condition B from the data previously memorized in the memory as a map. A plurality of discharge curves wherein the total current and the temperature are respectively varied, are preferably obtained previously as the map, for example. Also, the coincidence degree may be evaluated by a known procedure. Also, in addition to the total current and the temperature, the data with the highest coincidence degree may be selected as capacity condition B based on the number of discharge.

The determining section is set to determine an occurrence of an over discharge based on capacity condition A, and capacity condition B. The determining section preferably determines the occurrence of the over discharge when the difference between capacity condition B and capacity condition A is larger than a threshold. The threshold is set based on, for example, the total current (current value) and the temperature. Specifically, based on the total current and the temperature, the determining section preferably select the data with the highest coincidence degree as the threshold from the data previously memorized in the memory as a map. A plurality of threshold wherein the total current and the temperature are respectively varied, are preferably set previously, for example, as the map. Also, the coincidence degree may be evaluated by a known procedure. Also, in addition to the total current and the temperature, the data with the highest coincidence degree may be selected as the threshold based on the number of discharge.

The voltage changing section is set to change the first discharge cutoff voltage to a second discharge cutoff voltage that is higher than the first discharge cutoff voltage, when the occurrence of the over discharge is determined.

Among the above, it is preferable that the voltage changing section specifies capacity condition C corresponding to voltage α in an estimated discharge curve of an over discharged cell, specifies voltage β corresponding to capacity condition C in an actually measured discharge curve of the battery pack, and sets the second discharge cutoff voltage based on the voltage β. Here, the over discharged cell is referred to as a cell wherein the polarity is inverted during the discharge of the battery pack (a cell with a negative value battery voltage), and the abnormal cell in FIG. 3B corresponds thereto.

Based on the total current (current value) and the temperature, the voltage changing section may select the data with the highest coincidence degree as the estimated discharge curve of an over discharged cell from the data previously memorized in the memory as a map. A plurality of the estimated discharge curves wherein the total current and the temperature are respectively varied, are preferably obtained previously, for example, as the map. Also, the coincidence degree may be evaluated by a known procedure. Also, in addition to the total current and the temperature, the data with the highest coincidence degree may be selected as the estimated discharge curve of an over discharged cell based on the number of discharge. Also, a curve wherein the discharge curve of a normal cell is shifted overall to the lower capacity condition side (in other words, a curve wherein a predetermined amount is added to the capacity condition (X axis) of a discharge curve), may be selected as the estimated discharge curve of an over discharged cell. The shifted amount thereof may be a fixed value, and may be a variation value.

Here, as shown in FIG. 3B, capacity condition C (SOC 3.4%) at voltage α (0 V) is specified in the estimated discharge curve of an over discharged cell (abnormal cell). Voltage α may be less than 0 V, and may be 0 V or more, and the latter is preferable. The reason therefor is to suppress the occurrence of an over discharge effectively. Also, voltage α may be 0 V, and may be more than 0 V. In the latter case, voltage α is, for example, 0.1 V or more, may be 0.3 V or more, and may be 0.5 V or more. Meanwhile, voltage α may be, for example, 1 V or less.

Next, as shown in FIG. 3A, voltage β (298 V) corresponding to capacity condition C (SOC 3.4%) is specified in the actually measured discharge curve of battery pack A. The actually measured discharge curve of battery pack A may be calculated from the variation over time of the total voltage and the total current. Next, as shown in FIG. 3A, the second discharge cutoff voltage is set based on voltage β (298 V). Voltage β may be set to the second discharge cutoff voltage as it is, and the second discharge cutoff voltage may be set by adding a predetermined value to voltage β.

The value of the second discharge cutoff voltage is not particularly limited, and is, for example, 2.90 N (N is the number of the battery cells in the battery pack) or more, may be 2.95 N or more, and may be 3.00 N or more. Meanwhile, the value of the second discharge cutoff voltage is not particularly limited, and is for example, 3.30 N or less, may be 3.10 N or less, and may be 3.05 N or less. Also, the difference between the second discharge cutoff voltage and the first discharge cutoff voltage is not particularly limited, and is, for example, 0.1 N (N is the number of the battery cells in the battery pack) or more, may be 0.2 N or more, and may be 0.3 N or more.

The PCU is configure to carry out the start, continue and stop of the discharge (preferably discharge and charge) of the battery pack based on the determination of the ECU. For the PCU, those similar to a PCU in a usual battery system may be used. Also, the battery system in the present disclosure may include a display unit configured to display a warning when an over discharge occurs. Examples of the display unit may include a liquid crystal display.

Figure 7:
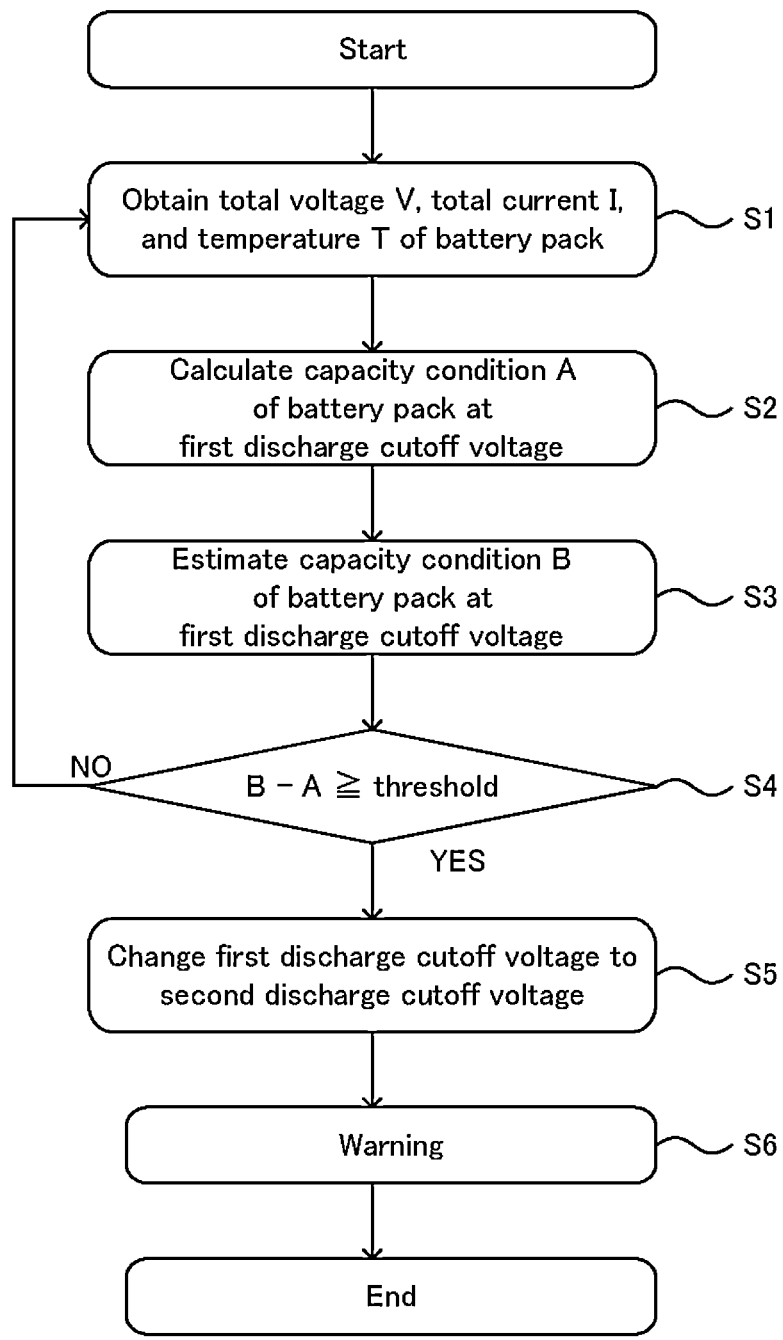
FIG. 7 is a flow chart illustrating processes carried out by a control unit in the present disclosure.

FIG. 7 is a flow chart illustrating processes carried out by a control unit in the present disclosure. In step S1, as shown in FIG. 7, total voltage V, total current I, and temperature T of a battery pack during discharge are obtained. In step S2, capacity condition A of the battery pack at the first discharge cutoff voltage is calculated based on total voltage V and total current I. In step S3, capacity condition B of the battery pack at the first discharge cutoff voltage is estimated based on total current I and temperature T. The difference between capacity condition B and capacity condition A (determining value) and the threshold previously memorized in the memory are compared in step S4, and return to step S1 when the determining value is less than the threshold. Meanwhile, when the determining value is the threshold or more, it is determined that an over discharge has occurred, and move ahead to step S5. In step S5, the first discharge cutoff voltage is changed to a second discharge cutoff voltage that is higher than the first discharge cutoff voltage. In step S6, a warning indicating an abnormal (over discharge) is displayed so as to complete the processes.

2. Battery Pack

The battery pack in the present disclosure include a plurality of battery cells connected in series.

(1) Battery Cell

The battery cell is provided with a power generation unit including a cathode layer, an anode layer, and an electrolyte layer formed between the cathode layer and the anode layer. Further, the battery cell is provided with a cathode current collector configured to collect currents of the cathode layer, and an anode current collector configured to collect currents of the anode layer.

The cathode layer includes at least a cathode active material, and preferably further includes at least one kind of an electrolyte, a conductive material, and a binder, as required. The kind of the cathode active material is not particularly limited, and examples thereof may include an oxide active material. Examples of the oxide active material may include rock salt bed type active materials such as $LiCoO_2$, $LiMnO_2$, $LiNiO_2$, $LiVO_2$, $LiNi_{1/3}Co_{1/3}Mn_{1/3}O_2$; spinel type active materials such as $LiMn_2O_4$, $Li_4Ti_5O_{12}$, and $Li(Ni_{0.5}Mn_{1.5})O_4$; and olivine type active materials such as $LiFePO_4$, $LiMnPO_4$, $LiNiPO_4$, and $LiCoPO_4$.

As the electrolyte to be used for the cathode layer, the material similar to the electrolyte to be used for the electrolyte layer described later may be used. Examples of the conductive material may include carbon materials such as acetylene black (AB), Ketjen black (KB), carbon fiber, carbon nanotube (CNT), and carbon nanofiber (CNF). Examples of the binder may include fluorine-based binders such as polyvinylidene fluoride (PVDF).

The anode layer includes at least an anode active material, and preferably further includes at least one kind of an electrolyte, a conductive material, and a binder as required. Examples of the anode active material may include carbon active materials such as graphite; and metal active materials such as Si, Sn, In, and Al. The electrolyte, the conductive material, and the binder may be in the same contents as those described for the cathode layer above.

The electrolyte layer includes at least an electrolyte. The electrolyte may be an inorganic solid electrolyte, may be a solid polymer electrolyte, may be an electrolyte solution (liquid electrolyte), and may be a semisolid electrolyte (clay type electrolyte). Among the above, the inorganic solid electrolyte is preferable. That is, the battery cell in the present disclosure is preferably an all solid state battery cell including a solid electrolyte layer including an inorganic solid electrolyte.

Examples of the inorganic solid electrolyte may include sulfide solid electrolyte, oxide solid electrolyte, nitride solid electrolyte, and halide solid electrolyte. Examples of the sulfide solid electrolyte may include solid electrolyte including a Li element, an X element (X is at least one kind of P, As, Sb, Si, Ge, Sn, B, Al, Ga, and In) and a S element. Also, the sulfide solid electrolyte may further include at least either one of an O element and a halogen element. Examples of the halogen element may include a F element, a Cl element, a Br element, and an I element.

The sulfide solid electrolyte may be a glass type solid electrolyte, may be a glass ceramic type solid electrolyte, and may be a crystal type solid electrolyte. Also, the sulfide solid electrolyte may include a crystal phase with high ion conductivity. Examples of the crystal phase may include a Thio-LISICON type crystal phase, a LGPS type crystal phase, and an algirodite type crystal phase.

Examples of the composition of the sulfide solid electrolyte may include $xLi_2S \cdot (1-x)P_2S_5$ ($0.7 \le x \le 0.8$), $yLiI \cdot zLiBr \cdot (100-y-z)Li_3PS_4$ ($0 \le y \le 30$, $0 \le z \le 30$). Other examples of the composition of the sulfide solid electrolyte may include $Li_{4-x}Ge_{1-x}P_xS_4$ (x satisfies $0<x<1$). In this composition, Sb, Si, Sn, B, Al, Ga, In, Ti, Zr, V, and Nb may be used instead of at least one of Ge and P. Also, a part of Li may be substituted with Na, K, Mg, Ca, and Zn. Further, a part of S may be substituted with a halogen (F, Cl, Br, I).

Examples of the oxide solid electrolyte may include solid electrolyte including a Li element, a Y element (Y is at least one kind of Nb, B, Al, Si, P, Ti, Zr, Mo, W, and S) and an O element. Specific examples of the oxide solid electrolyte may include a garnet type solid electrolyte such as $Li_7La_3Zr_2O_{12}$, a perovskite type solid electrolyte such as (Li, La)$TiO_3$, a nasicon type solid electrolyte such as Li(Al, Ti) $(PO_4)_3$. Also, examples of the nitride solid electrolyte may include $Li_3N$. Examples of the halide solid electrolyte may include LiCl, LiI, and LiBr.

A generally used current collector may be used for the cathode current collector and the anode current collector. Also, the kind of the exterior body is not particularly limited, and it may be a laminated type exterior body, and may be a case type exterior body.

The battery cell in the present disclosure may include only one power generation unit of cathode layer, electrolyte layer and anode layer, and may include two or more thereof. In the latter case, a plurality of the power generation units are preferably placed along the thickness direction. Also, a bipolar structure may be formed with a plurality of the power generation units. Also, the kind of the battery cell is not particularly limited, and is preferably a lithium ion battery.

(2) Battery Pack

The battery pack includes a plurality of battery cells connected in series. The number of the battery cells in the battery pack is usually 2 or more, may be 6 or more, may be 10 or more, and may be 20 or more. Meanwhile, the number of the battery cells in the battery pack is, for example, 1000 or less, and may be 500 or less.

The total voltage (fully charged) of the battery pack is, for example, 5 V or more, may be 10 V or more, may be 30 V or more, and may be 100 V or more. Meanwhile, the total voltage (fully charged) of the battery pack is, for example, 400 V or less.

3. Monitoring Unit

The battery system in the present disclosure is provided with a monitoring unit configured to monitor a condition of the battery pack. Specifically, the monitoring unit includes a voltage sensor (total voltage sensor) configured to measure a total voltage of the battery pack, a current sensor (total current sensor) configured to measure a total current of the battery pack, and a temperature sensor configured to measure a temperature of the battery pack. A generally used sensor may be used for the voltage sensor, the current sensor, and the temperature sensor, respectively.

Meanwhile, the monitoring unit preferably includes no voltage sensor (individual voltage sensor) configured to measure a voltage of the battery cell individually. The reason therefor is to avoid the complication of the sensor element. Incidentally, when the number of the battery cell in the battery pack is regarded as N (N≥10) the monitoring unit may include N/10 or less individual voltage sensor.

REFERENCE SIGNS LIST

1 . . . cathode layer
2 . . . anode layer
3 . . . electrolyte layer
4 . . . cathode current collector
5 . . . anode current collector
6 . . . exterior body
10 . . . battery pack
11 . . . monitoring unit
12 . . . control unit
13 . . . power source
14 . . . load
20 . . . battery system

What is claimed is:

1. A process of using a battery system, the battery system comprising:
  a battery pack including a plurality of battery cells connected in series,
  a monitoring unit configured to monitor a condition of the battery pack, and
  a control unit configured to control at least a discharge of the battery pack, and
  the monitoring unit includes:
  a voltage sensor configured to measure a total voltage of the battery pack,
  a current sensor configured to measure a total current of the battery pack, and
  a temperature sensor configured to measure a temperature of the battery pack,
  the process comprising the control unit:
  calculating capacity condition A of the battery pack at a first discharge cutoff voltage based on the total voltage and the total current,
  estimating capacity condition B of the battery pack at the first discharge cutoff voltage based on the total current and the temperature,
  determining an occurrence of an over discharge based on the capacity condition A and the capacity condition B, and
  changing the first discharge cutoff voltage to a second discharge cutoff voltage that is higher than the first discharge cutoff voltage, when the occurrence of the over discharge is determined.

2. The process according to claim 1, wherein the process further comprises the control unit specifying capacity condition C corresponding to voltage $\alpha$ in an estimated discharge curve of an over discharged cell,
  Specifying voltage $\beta$ corresponding to the capacity condition C in an actually measured discharge curve of the battery pack, and
  setting the second discharge cutoff voltage based on the voltage $\beta$.

3. The process according to claim 2, wherein the voltage $\alpha$ is a voltage of 0 V or more.

4. The process according to claim 1, wherein the monitoring unit includes no voltage sensor configured to measure a voltage of the battery cells individually.

* * * * *